US012410510B2

(12) United States Patent
Schwerdt et al.

(10) Patent No.: US 12,410,510 B2
(45) Date of Patent: Sep. 9, 2025

(54) COATING PLANT FOR COATING A PLANAR OBJECT AND A METHOD FOR COATING A PLANAR OBJECT (71) Applicant: THYSSENKRUPP STEEL EUROPE AG, Duisburg (DE)

(72) Inventors: Christian Schwerdt, Duisburg (DE); Andre Samusch, Dortmund (DE)

(73) Assignee: THYSSENKRUPP STEEL EUROPE AG, Duisburg (DE)

( * ) Notice: Subject to any disclaimer, the term of this patent is extended or adjusted under 35 U.S.C. 154(b) by 10 days.

(21) Appl. No.: 18/569,325

(22) PCT Filed: May 30, 2022

(86) PCT No.: PCT/EP2022/064537
§ 371 (c)(1),
(2) Date: Dec. 12, 2023

(87) PCT Pub. No.: WO2023/280464
PCT Pub. Date: Jan. 12, 2023

(65) Prior Publication Data
US 2024/0271268 A1 Aug. 15, 2024

(30) Foreign Application Priority Data
Jul. 7, 2021 (DE) .................. 10 2021 117 574.7

(51) Int. Cl.
C23C 14/20 (2006.01)
C23C 14/24 (2006.01)
C23C 14/56 (2006.01)

(52) U.S. Cl.
CPC ............ C23C 14/24 (2013.01); C23C 14/562 (2013.01)

(58) Field of Classification Search
CPC ....... C23C 14/24; C23C 14/562; C23C 14/16; C23C 16/54; C23C 16/45551;
(Continued)

(56) References Cited

U.S. PATENT DOCUMENTS 4,331,526 A * 5/1982 Kuehnle ............... C23C 14/562
204/298.24
5,223,038 A * 6/1993 Kleyer .................. C23C 14/562
118/726
(Continued)

FOREIGN PATENT DOCUMENTS

CN 105624611 6/2016
KR 20200082026 7/2020
(Continued)

OTHER PUBLICATIONS

International Search Report filed in PCT/EP2022/064537 mailed Sep. 9, 2022.

Primary Examiner — Rudy Zervigon
(74) Attorney, Agent, or Firm — RANKIN, HILL & CLARK LLP (57) ABSTRACT A coating plant for coating a planar object, for example a strip conveyed using transport rollers, is disclosed. The coating plant includes a vacuum chamber and a device for vapor deposition of a material. The device for vapor deposition includes an evaporation portion and a nozzle portion, wherein the nozzle portion includes a nozzle having a nozzle outlet. The nozzle outlet can have an extension. The nozzle is rotatably mounted.

10 Claims, 6 Drawing Sheets (58) Field of Classification Search
CPC . C23C 16/545; C23C 16/4412; C23C 14/568; C23C 16/4401; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC ................. 118/719; 156/345.31, 345.32
See application file for complete search history.

(56) References Cited

U.S. PATENT DOCUMENTS

| | | | | |
|---|---|---|---|---|
| 5,273,911 | A * | 12/1993 | Sasaki | C23C 16/545 |
| | | | | 136/258 |
| 5,350,598 | A * | 9/1994 | Kleyer | C23C 14/562 |
| | | | | 427/259 |
| 6,328,221 | B1 * | 12/2001 | Moore | C23C 16/45589 |
| | | | | 118/715 |
| 6,656,284 | B1 * | 12/2003 | Hwang | C23C 16/45578 |
| | | | | 438/782 |
| 8,317,922 | B2 * | 11/2012 | Lee | C23C 14/12 |
| | | | | 118/724 |
| 2001/0005553 | A1 * | 6/2001 | Witzman | C23C 14/562 |
| | | | | 118/723 VE |
| 2006/0090705 | A1 * | 5/2006 | Kim | C23C 14/046 |
| | | | | 118/726 |
| 2008/0017320 | A1 * | 1/2008 | Choi | H01L 21/6776 |
| | | | | 156/345.54 |
| 2009/0165717 | A1 * | 7/2009 | Lee | C23C 14/246 |
| | | | | 118/724 |
| 2011/0000431 | A1 | 1/2011 | Banaszak | |
| 2011/0123707 | A1 * | 5/2011 | Lee | C23C 14/243 |
| | | | | 118/720 |
| 2011/0303362 | A1 * | 12/2011 | Saito | H01L 21/67069 |
| | | | | 156/345.33 |
| 2012/0285380 | A1 * | 11/2012 | Dussert-Vidalet | |
| | | | | C23C 16/45587 |
| | | | | 118/719 |
| 2013/0260499 | A1 | 10/2013 | Sonoda | |
| 2013/0288402 | A1 * | 10/2013 | Morita | H10K 71/00 |
| | | | | 118/712 |
| 2015/0031157 | A1 * | 1/2015 | Elam | C23C 16/45544 |
| | | | | 438/46 |
| 2017/0342542 | A1 * | 11/2017 | Ghosh | C23C 14/24 |
| 2018/0290168 | A1 * | 10/2018 | Han | C23C 16/45565 |

FOREIGN PATENT DOCUMENTS

| | | |
|---|---|---|
| RU | 2012117996 | 11/2013 |
| WO | 2015086049 | 6/2015 |
| WO | 2019239227 | 12/2019 |
| WO | 2019239229 | 12/2019 |

* cited by examiner

COATING PLANT FOR COATING A PLANAR OBJECT AND A METHOD FOR COATING A PLANAR OBJECT

The invention relates to a coating plant for coating a planar object and to a method for coating a planar object.

BACKGROUND

Methods based on the principle of so-called vapor deposition are known for coating planar objects, for example strips, in particular strip metal, such as strip steel. Vapor deposition is based on the principle of coating a surface of the planar object, which can be, for example, strip steel or a sheet of glass, by means of depositing material present in the gas phase. For this purpose, the material is first provided as a starting material. The starting material is then brought into a gas phase. The constituents of the material, in particular atoms and/or ions, present in the gas phase settle on the surface to be coated and thereby form a coating.

Known vapor deposition methods are so-called chemical vapor deposition (CVD), physical vapor deposition (PVD) and so-called arc evaporation. The methods mentioned differ in particular in terms of the mechanisms used to bring about the gas phase.

One advantage of vapor deposition is that coatings, the properties of which can be targetedly influenced to a large extent and within broad property windows, can be produced quite economically. Another advantage is that vapor deposition is suitable for producing coatings of different materials. Vapor deposition is also suitable, for example, for producing coatings comprising a high-melting material. Vapor deposition also facilitates coatings in which the material is present in the metastable phase and thereby has certain properties, for example mechanical or optical properties, which are not present in a stable phase state.

A recently developed variant of physical vapor deposition is known to a person skilled in the art under the name of jet vapor deposition, or JVD for short. Jet vapor deposition is based on the principle of evaporating the starting material in an evaporation portion of a device for vapor deposition of the material, for example in an evaporator designed as a crucible, and to targetedly guide the material then present in the gas phase at a comparatively high pressure through a nozzle portion in the direction of the surface to be coated by vapor deposition. To this end, the surface to be coated by vapor deposition is usually placed in an atmosphere which has a negative pressure relative to the atmosphere prevailing in the evaporation portion. In many cases, the negative pressure is a vacuum having, for example, between 0.1 mbar and 20 mbar, preferably less than 1 mbar, residual gas pressure. The JVD method reveals its advantages in particular in the large-area coating of planar objects, in particular of strip metal, particularly strip steel. An advantage of JVD is that the comparatively high pressure with which the material present in the gas phase is directed toward the surface to be coated by vapor deposition facilitates coating at high strip speeds and consequently quite economically.

WO 2016/042079 A1 discloses a device with which a starting material can be brought into the gas phase so that it can then be deposited on a surface to be coated by vapor deposition. The material used to form the respective coating is, for example, in wire or strip form. In a pre-evaporation portion upstream of an evaporation portion, the starting material is brought into the sphere of influence of an electric arc, wherein preferably two wires or two strips of the starting material are present, one of which is connected as a cathode and one of which is connected as an anode to a DC electric voltage source, and a voltage sufficient to form an arc is set using the DC voltage source. The material melted and/or evaporated by means of the energy from the arc flows by means of a gas stream of a gas or gas mixture into the evaporation portion which is designed as a chamber, the walls of which have a temperature which is above the evaporation temperature of the elementary constituents of the material used for the coating process. In the chamber, the constituents of the material evaporate completely and then pass through an opening in the chamber and into a nozzle portion and are guided through this nozzle portion in the direction of the surface to be coated. The constituents of the material act on the surface to be coated where they form a coating.

Both the JVD described at the outset and the exemplary embodiment of a device for the vapor deposition of material described in WO 2016/042 079 A1 are two exemplars of vapor deposition, in which, in the case of WO 2016/042 079 A1, the starting material in an evaporation portion is additionally brought into its gas phase by means of evaporation with an upstream pre-evaporation portion for arc evaporation and is then guided through a nozzle portion to the surface to be coated. The movement of the particles present in the gas phase, in particular atoms and/or ions, is at least substantially, preferably completely, brought about by the pressure difference between the evaporation portion and the space, for example a vacuum chamber, in which the planar object to be coated is located or through which it is guided.

When coating planar objects by means of a device for the vapor deposition of material using evaporation, one challenge is to obtain good homogeneity of the layer thickness of the coatings in the transverse direction of the planar object, for example along an entire strip width. In addition, it is desirable to be able to provide good homogeneity of the layer thickness distribution along an entire extension in the transverse direction.

SUMMARY

A coating plant according to the invention serves the purpose of being able to coat a planar object. In particular, a strip, preferably strip metal such as strip steel, can be provided as a planar object. The coating process is carried out with a material present in the gas phase, in particular on the basis of one of the mechanisms described at the outset.

The coating plant has a vacuum chamber through which the planar object to be coated can be guided.

The coating plant also comprises a device for vapor deposition of the material. The vapor deposition device comprises in particular an evaporation portion and a nozzle portion.

The evaporation portion is designed, for example, as an evaporation crucible, preferably with a cylindrical, in particular circular-cylindrical, portion. The evaporation portion preferably consists partially or completely of graphite or CFC (carbon fiber reinforced carbon). A base portion and/or a wall, preferably all the walls, of the evaporation portion are designed to be heatable, for example by means of heating coils, in order to heat the evaporation portion to a temperature above the evaporation temperature of the starting material.

The terms "gas phase" and "evaporation" are used throughout the description as they are typical in the field of the technology described. The term "gas phase" in this case includes the fact that a low weight fraction, for example up to 30 wt. %, preferably not more than 10 wt. %, of the material present in the gas phase may not be present in the gas phase in a physical sense, but instead as an aerosol and/or as a cluster. The term "evaporation" includes the fact that, depending on the material and technology used, the particles also transition into the gas phase at least partially by means of other mechanisms, for example by sublimation. The term "evaporation" thus additionally comprises further mechanisms, in particular sublimation, in addition to evaporation in the strictly physical sense, i.e., a "liquid->gas phase" transition.

The nozzle portion is indirectly or directly coupled to the evaporation portion. The nozzle portion has a nozzle which is arranged within the vacuum chamber and comprises an opening out of which the constituents of the material present in the gas phase can escape from the nozzle. The nozzle outlet is oriented in the coating plant in such a way that gas phase particles exiting the nozzle outlet are directed to the location where the surface to be coated, i.e. the planar object, is arranged. The planar object is passed through the vacuum chamber so that the surface of the planar object to be coated is coated with condensing material that is continuously applied to the surface and deposited thereon.

According to the invention, it is provided that the nozzle is rotatably mounted. The rotatable mounting serves to change the orientation of the nozzle outlet relative to the surface to be coated. Since the nozzle is mounted so as to be rotatable and the orientation of the nozzle outlet relative to the surface to be coated is variable, the manner in which the material present in the gas phase is directed toward the surface of the planar object can be influenced or adjusted in a targeted manner. Particularly preferred is an embodiment in which the nozzle portion is rotatably mounted so as to rest against the evaporation portion, i.e., the evaporation portion functions as a sliding bearing for the nozzle portion. In such an embodiment, in particular an evaporation portion produced partially or completely from graphite and/or CFD brings into play the advantage that carbon functions as a natural lubricant. Alternatively or additionally, it is possible, irrespective of the material of which the evaporation portion consists, for graphite in the form of powder and/or paste to be used as a lubricant, and to be introduced between the adjacent surfaces of the evaporation portion and nozzle portion that slide over one another for this purpose.

The nozzle outlet can be designed as a slot, for example. It is particularly preferred that the nozzle outlet lies in a plane which is parallel to the surface to be coated, at least in the portion in which the coating process takes place, wherein particularly preferably the nozzle can assume a position in which the slot is located perpendicularly to a direction of movement, also as a transport direction, of the surface to be coated and is rotatable thereabout with an axis of rotation which is perpendicular to the surface to be coated. In particular, it can be provided that the length of the slot-like nozzle is selected such that, at an angle $\alpha$ of 90 degrees between the transport direction and the slot-like nozzle, a width of the planar object, for example a strip width, is completely covered for those strips having the maximum width, for the feedthrough of which the vacuum chamber is designed. By adjusting the angle $\alpha$, the effective coating width perpendicular to the strip direction of travel can then be changed with the factor $\sin(\alpha)$. A device provided in this way is in particular suitable for facilitating, in the case of coating planar objects as intended, in particular strips having a strip width which is smaller than the longitudinal extension of a slot-like nozzle outlet, with high efficiency, so that none of the material present in the gas phase is deposited, or a proportion of the material exceeding a tolerated amount is not deposited, past the two strip edges and within the vacuum chamber without being available for coating the surface.

By providing the rotatable nozzle, two advantages are thus achieved in particular: on the one hand, the starting material provided is deployed and used as efficiently as possible; on the other hand, contamination of the vacuum chamber when coating narrower strips is avoided. More generally, it is achieved with the coating plant according to the invention and the developments thereof that there is a high degree of flexibility with regard to the possible width of a surface to be coated perpendicularly to its transport direction, without compromising economy and efficiency.

In a preferred embodiment, the object to be coated is a strip, in particular strip metal, for example made of steel, and the coating plant has a belt transport device for transporting the strip, preferably comprising a first transport roller device at the first end of the vacuum chamber and a second transport roller device at the second end of the vacuum chamber, wherein the strip is transported past the nozzle, between the first and the second end and through the vacuum chamber.

In a preferred embodiment, the strip is guided in a heated channel in the region of the nozzle outlet in order to prevent excessively high cooling and premature condensation resulting therefrom of the gas between the nozzle outlet and the deposition on the strip.

In a preferred embodiment, the nozzle is mounted such that, when the nozzle is rotated, the nozzle outlet performs a rotational movement in a plane parallel to the surface. As a result of a rotation which is carried out in parallel with the surface, i.e., the nozzle outlet describes a surface which lies in a plane parallel to the surface to be coated during rotation, it is ensured that, irrespective of the angle of rotation at which the nozzle is rotated relative to the transport direction, homogeneous coating of the surface to be coated in the transverse direction—i.e., in the direction perpendicular to the transport direction, is ensured.

It is particularly preferred that an axis of rotation for rotating the nozzle is oriented perpendicularly to the surface, which, by correspondingly positioning the vapor deposition device within the vacuum chamber, taking into account the conveyance of the planar object, can always be implemented with conventional design measures by a person skilled in the art commissioned to carry out this development.

Particularly preferred is an embodiment in which a nozzle outlet located within the nozzle is shaped in such a way that the material in the gas phase exiting the nozzle outlet exits the nozzle in the direction of the axis of rotation, that is to say that, for example when the axis of rotation is oriented perpendicularly to the surface to be coated, the material in the gas phase acts on the surface in the direction perpendicular to the surface to be coated. It is also very particularly preferred if the nozzle outlet is additionally shaped such that the main exit direction of the material in the gas phase passes perpendicularly through the area described by the nozzle outlet.

In a particularly preferred development of the coating plant, the nozzle has a cylindrical, preferably circular-cylindrical, external mold section, wherein the external mold section is toothed in a peripheral portion of its circumference or over its entire circumference with teeth. The teeth are in engagement with a drivable counter element engaging in the teeth such that the nozzle is rotated by driving the counter element. The term "external mold section" denotes a portion of the nozzle portion, the name of which relates to the fact that the outer casing of the external mold section has a function caused by its shape, for example the provision of teeth.

The counter element is preferably a pinion which is coupled to a shaft. Preferably, the shaft is guided out of the vacuum chamber by a suitable sealing element of known design. The shaft is coupled to a rotary drive for rotating the shaft and for rotating the nozzle as a result thereof. In other words, the nozzle and thus in particular the nozzle outlet can be rotated from the exterior of the vacuum chamber by the shaft inserted into the vacuum chamber via the teeth that are in engagement with the pinion. In a particularly preferred development of the coating plant, the nozzle has a cylindrical, preferably circular-cylindrical, external mold section, wherein the external mold section is fitted into a sprocket or comprises a sprocket. The sprocket is in engagement with a drivable counter element engaging in the sprocket such that the nozzle is rotated by driving the counter element.

The counter element is preferably a pinion which is coupled to a shaft. Preferably, the shaft is guided out of the vacuum chamber by a suitable sealing element of known design. The shaft is coupled to a rotary drive for rotating the shaft and for rotating the nozzle as a result thereof. In other words, the nozzle and thus in particular the nozzle outlet can be rotated from the exterior of the vacuum chamber by the shaft inserted into the vacuum chamber via the sprocket which is in engagement with the pinion. In a particularly preferred embodiment, the shaft, which comprises the pinion, and the axis of rotation of the nozzle are oriented in parallel with one another, which is associated with the advantage of a potentially structural implementation of the coating plant. Particularly preferably, both the pinion and sprocket are provided with spur teeth, which results in a particularly easily implementable and mechanically robust embodiment.

In one embodiment comprising a sprocket, the sprocket is provided with teeth, for example, in a peripheral portion of the circumference thereof, or, for example, completely in the circumference thereof. In a preferred embodiment, the nozzle and the sprocket are designed to be thermally isolated from one another by a thermal insulating means arranged between the external mold section of the nozzle and the sprocket. This ensures that the sprocket and the drivable counter element engaging in the sprocket, as well as any further elements that may be present and coupled thereto, such as the above-mentioned shaft leading out of the vacuum chamber, are protected against losing their structural integrity prematurely due to high temperatures. This is advantageous in particular in light of the fact that the evaporation portion, which is in indirect or direct contact with the nozzle, is heated for evaporating the material, wherein the temperatures to be used can assume very high values as a function of the material to be evaporated according to the evaporation temperature thereof.

The thermal insulating means is preferably designed as an insulator ring. Particularly preferably, the insulator ring comprises or consists of a ceramic material. An example of a possible ceramic material is aluminum oxide (Al2O3). The advantage of using a ceramic material is that it has high resistance to chemical degradation and low thermal conductivity.

In an alternative embodiment, the counter element is designed as a worm shaft which is coupled to a shaft leading out of the vacuum chamber. The shaft is coupled to a rotary drive, with which the shaft is designed to be rotatable, wherein the rotation of the shaft brings about the rotation of the nozzle. The shaft is preferably oriented perpendicularly to the axis of rotation of the nozzle, preferably additionally tangentially to the teeth, for example to the sprocket, wherein the teeth, for example the sprocket, is toothed in a manner complementary to the worm shaft, i.e., with helical teeth. The shaft preferably has a coolant feedthrough through which coolant can be passed for cooling the shaft. In this embodiment, in contrast to the embodiment explained above, the sprocket is not insulated from the evaporation portion by means of insulating means, instead the direct cooling of the shaft, preferably also of the worm shaft, is provided by passing a coolant through the coolant feedthrough arranged within the shaft, which coolant feedthrough is preferably a component of a coolant circuit.

Particularly preferably, the shaft comprises a coupling means, for example a universal joint, with which the shaft is provided with a transverse degree of freedom of movement. The shaft can be moved out of engagement with the teeth, for example the sprocket, by means of a coupling piece and a transverse drive means coupled thereto, and back into engagement with the teeth, for example the sprocket, wherein the degree of freedom of movement is preferably oriented perpendicularly to the axis of rotation of the nozzle. By providing the movability of the worm shaft away from the teeth, for example away from the sprocket, and towards it, a thermal load on the worm shaft and the shaft can be reduced by reducing the contact time to periods in which contact is actually necessary to produce a rotational movement of the nozzle; in other periods, the thermal load on the worm shaft and the shaft can be reduced by moving the worm shaft away, which means the worm shaft is disengaged from the teeth, for example the sprocket. In a special case, it is provided that the shaft with the worm shaft has both the coolant feedthrough described two paragraphs ago and the degree of freedom of movement described in the preceding paragraph in a direction perpendicular to the axis of rotation of the nozzle and, in addition, explicitly does not have a thermal insulation means between the sprocket and the external mold section, i.e., as a result of the possibility of minimizing the periods of thermal load on the worm shaft and the axis driving it, the additional advantage is achieved of being able to dispense with a thermal insulation means. In a particularly specific embodiment, the teeth are realized as a sprocket, and the sprocket is an integral part of the external mold section.

Particularly preferably, the axis of rotation is additionally movable in a direction perpendicular to the axis of rotation.

Alternatively or additionally, the nozzle outlet can be adjusted in eccentricity relative to the axis of rotation, i.e., the nozzle inlet and/or the axis of rotation can be adjusted such that the axis of rotation is not at a point of symmetry of the nozzle outlet. Using the example of a slot-like nozzle outlet, this means, for example, that although the axis of rotation preferably intersects the nozzle outlet, it divides it into two longitudinal portions of the nozzle outlet, which have different lengths.

For example, the nozzle portion has at least one closing means for partially or completely closing the nozzle outlet, i.e., a mechanical means with which the nozzle outlet can be temporarily at least partially closed. With the partial closing of the nozzle outlet, a symmetrical position of the axis of rotation relative to the nozzle outlet is changed to an asymmetrical position of the axis of rotation to the nozzle outlet, and an eccentricity of the axis of rotation is thereby adjusted with respect to the part of the nozzle outlet that is left open. The adjustability of the eccentricity is thus brought about or brought about proportionally by changing the surface portion of the nozzle outlet through which material passes out of the nozzle outlet.

To adjust the nozzle outlet, a closing means designed as a sliding flap can, for example, be provided for partially closing the nozzle outlet from one end, whereby it is achieved that the nozzle outlet is shorter on one side of the axis of rotation than on the other side, i.e., that the axis of rotation is thus positioned eccentrically with respect to the resulting nozzle outlet. In such a case, an adaptation of the coating, by rotating the shaft and by the adjustment that follows of the longitudinal extension of the axis of rotation projected onto the surface to be coated, can be adjusted with even more flexibility and thereby a flexible selection of planar objects to be coated, in particular strips, can also be ensured.

As an alternative or additional measure for bringing about an eccentric movement of the nozzle outlet, a specific embodiment can also be provided in which, although the external mold section in a toothed peripheral portion, preferably in a toothed peripheral portion of the sprocket, is circular-cylindrical with a peripheral portion having an axis of rotation in the central axis of the teeth, preferably the toothed peripheral portion of the sprocket, beyond this the axis of rotation is positioned eccentrically relative to the nozzle outlet. The specification that the external mold section in a toothed peripheral portion, for example of the sprocket, is circular-cylindrical with an axis of rotation in the central axis of the toothed peripheral portion, for example of the sprocket, is to be understood to mean that a peripheral portion, for example of the sprocket, represents a portion of a toothed circular cylinder, and the axis of this toothed circular cylinder corresponds to the axis of rotation of the nozzle portion. Beyond this specification, the axis of rotation is displaced eccentrically relative to the nozzle outlet of the nozzle portion as required. An eccentric displacement of the axis of rotation relative to the nozzle outlet of the nozzle portion is preferably to be understood such that either the axis of rotation does not intersect the nozzle outlet or, if the axis of rotation intersects the nozzle outlet, the point of intersection between the axis of rotation and the nozzle outlet is not a point of symmetry of the nozzle outlet. In the specific case that the nozzle outlet is designed as a slot, an eccentric displacement of the axis of rotation relative to the nozzle outlet of the nozzle portion is preferably to be understood such that either the axis of rotation does not intersect the nozzle outlet or, if the axis of rotation intersects the nozzle outlet, the point of intersection of the axis of rotation does not halve the slot in the longitudinal direction of the slot. In a particularly advantageous manner, the eccentric rotation of a slot-shaped nozzle outlet takes effect, in the case of the particularly preferred embodiment, in that the slot length corresponds to at least 20 times, preferably 100 times, the slot width and, either if the axis of rotation does not intersect the nozzle outlet or if the axis of rotation intersects the nozzle outlet, the point of intersection of the axis of rotation divides the slot into two portions, wherein the longer portion is at least 110 percent, preferably at least 120 percent, of the length of the shorter portion.

As already mentioned above, the term "external mold section" refers to a section of the nozzle portion, wherein its name relates to the fact that the outer casing of the external mold section has a function caused by its shape, for example the provision of teeth. In an embodiment comprising a sprocket, the external mold section, for example, is the section of the nozzle portion in the axial direction which is fitted into the sprocket.

Alternatively or additionally, the eccentric orientation of the axis of rotation relative to the nozzle outlet can also be implemented in a simple manner in terms of design by the nozzle outlet being positioned accordingly, for example by the external mold section being circular-cylindrical with the axis of rotation on its axis, but wherein the nozzle outlet is spaced apart from the axis of rotation or the axis of rotation intersects the nozzle outlet, but does not halve it.

In a preferred specific variant, the device for the vapor deposition of material is a jet vapor deposition plant, wherein the evaporation portion is preferably designed as a crucible. A person skilled in the art would understand the term "jet vapor deposition plant" to be a plant in which the coating material is brought into the gas phase using heat and it is then transported to the substrate, typically with a carrier gas stream of inert gas, preferably at a gas stream speed above the speed of sound, particularly preferably above 500 m/s. The mode of operation is found, for example, in the review article in the Handbook of Deposition Technologies for Films and Coatings Science, Applications and Technology, 2010, pp. 881-901, https://doi.org/10.1016/B978-0-8155-2031-3.00018-1 (linked on the filing date). The present invention can be realized with such a jet vapor deposition plant.

In an alternative preferred embodiment, a pre-evaporation portion is arranged upstream of the evaporation portion, which pre-evaporation portion in particular comprises a spray head including a carrier gas flow supply to the spray head and an injector tube from the spray head toward the evaporation portion. The starting material is supplied to the spray head, preferably in the form of wire or as a strip. The starting material is prepared in the spray head, which means that constituents of the starting material are evaporated and/or separated from the starting material as particles present in liquid phase, preferably by means of arc evaporation between starting material connected as the cathode and starting material connected as the anode. The prepared starting material is not completely present in gas phase, but instead consists of a mixture in particular of gas phase and liquid particles or partially liquid particles, which mixture is suitable for being guided through the evaporation portion in order to be re-evaporated there, i.e., to be completely or largely completely converted into the gas phase by heating which takes place there.

The evaporation portion is preferably designed as a crucible. The evaporation portion is heated in order to convert the prepared starting material into the gas phase. The temperature to which the evaporation portion is heated depends on the coating material; it must generally be higher than the evaporation temperature of the prepared starting material. The evaporation portion is preferably designed as a crucible designed as a cyclone, since a cyclone shape is a space-saving design which allows for efficient guidance of the gas flow through the crucible. A further advantage of a crucible designed in the form of a cyclone is its high reliability in almost completely evaporating the material flowing through, thereby ensuring that the coating deposited is of high quality, a bombardment of the strip with coating material still present in the liquid phase can be virtually ruled out if used appropriately.

Another concept relates to a method for coating a planar object with a material present in the gas phase. The coating plant of the type mentioned at the outset or one of the developments thereof is used for coating. A longitudinal extension of the nozzle, which is designed, for example, as a slot, is greater than the width of the planar object in its transverse direction (transverse direction: direction on the surface perpendicular to the direction of travel, for example the direction of travel of the strip). The orientation of the nozzle relative to the surface to be coated is changed by rotating the nozzle in such a way that both the entire lateral extent of the surface to be coated is coated with material exiting the nozzle outlet and material directed past the surface does not exceed a tolerated maximum overhang, at least at one edge, preferably at both edges.

Analogously to the above explanations, according to one variant, it can be provided that an external mold section of the nozzle is circular-cylindrical, at least in the peripheral portion having teeth, and has an axis of rotation in the central axis of the peripheral portion, wherein, however, the axis of rotation is also positioned eccentrically relative to the nozzle outlet.

For example, according to one variant, it can be provided that an external mold section of the nozzle is circular-cylindrical, at least in the portion having a sprocket, and has an axis of rotation in the central axis of the sprocket, wherein, however, the axis of rotation is also positioned eccentrically relative to the nozzle outlet.

For example, the nozzle portion can comprise at least one closing means for partially or completely closing the nozzle outlet, i.e., a mechanical means with which the nozzle outlet can be temporarily closed, at least in part. With the partial closing of the nozzle outlet, a symmetrical position of the axis of rotation relative to the nozzle outlet is changed to an asymmetrical position of the axis of rotation relative to the nozzle outlet, and an eccentricity of the axis of rotation is thereby adjusted with respect to the part of the nozzle outlet that is left open. The adjustability of the eccentricity is thus brought about or brought about proportionally by changing the surface portion of the nozzle outlet through which material passes out of the nozzle outlet.

To adjust the nozzle outlet, a closing means designed as a sliding flap can, for example, be provided for partially closing the nozzle outlet from one end, whereby it is achieved that the nozzle outlet is shorter on one side of the axis of rotation than on the other side, i.e., that the axis of rotation is thus positioned eccentrically with respect to the resulting nozzle outlet. In such a case, an adaptation of the coating, by rotating the shaft and by the adjustment that follows of the longitudinal extension of the axis of rotation projected onto the surface to be coated, can be adjusted with even more flexibility and thereby a flexible selection of planar objects to be coated, in particular strips, can also be ensured.

Depending on the dimensions of the planar object prior to coating and/or during coating, the closing means is preferably adjusted in such a way that the entire width is coated with material exiting the nozzle outlet and, at least at one edge, preferably at both edges, material directed past the surface does not exceed a tolerated maximum overhang. For adjustability during the coating process, the closing means can, for example, be coupled to an actuator which can be actuated electrically or electromagnetically. The advantage of this procedure is that, as a result of the change to the opening of the nozzle outlet, excessive coating material acting on of the interior of the coating plant is reduced and the effort required to clean the coating plant is thereby reduced.

in a toothed peripheral portion, preferably in a toothed peripheral portion of the sprocket, is circular-cylindrical with a peripheral portion having an axis of rotation in the central axis of the teeth, preferably the toothed peripheral portion of the sprocket, but beyond this the axis of rotation is also positioned eccentrically relative to the nozzle outlet.

The specification that the external mold section in a toothed peripheral portion, for example of the sprocket, is circular-cylindrical and has an axis of rotation in the central axis of the toothed peripheral portion, for example of the sprocket, is to be understood to mean that a peripheral portion, for example of the sprocket, represents a portion of a toothed circular cylinder, and the axis of this toothed circular cylinder corresponds to the axis of rotation of the nozzle portion. Beyond this specification, the axis of rotation is displaced eccentrically relative to the nozzle outlet of the nozzle portion as required. An eccentric displacement of the axis of rotation relative to the nozzle outlet of the nozzle portion is preferably to be understood such that either the axis of rotation does not intersect the nozzle outlet or, if the axis of rotation intersects the nozzle outlet, the point of intersection between the axis of rotation and the nozzle outlet is not a point of symmetry of the nozzle outlet. In the specific case that the nozzle outlet is designed as a slot, an eccentric displacement of the axis of rotation relative to the nozzle outlet of the nozzle portion is preferably to be understood such that either the axis of rotation does not intersect the nozzle outlet or, if the axis of rotation intersects the nozzle outlet, the point of intersection of the axis of rotation does not halve the slot in the longitudinal direction of the slot. In a particularly advantageous manner, the eccentric rotation of a slot-shaped nozzle outlet takes effect, in the case of the particularly preferred embodiment, in that the slot length corresponds to at least 20 times, preferably 100 times, the slot width and, either if the axis of rotation does not intersect the nozzle outlet or if the axis of rotation intersects the nozzle outlet, the point of intersection of the axis of rotation divides the slot into two portions, wherein the longer portion is at least 110 percent, preferably at least 120 percent, of the length of the shorter portion.

Despite the flexibility which does not exist, an embodiment of the coating plant comprising an eccentric axis of rotation as a result of the geometry of the nozzle portion in the manner described has the advantage that the object to be coated is acted upon as desired in a simple manner and only by the shape of the nozzle outlet, without a high number of potentially high-maintenance components being present.

In all cases in which the eccentric displacement of the axis of rotation is addressed above, when implemented appropriately by a person skilled in the art, the result is that, in a case in which material present in gas phase does not exit the nozzle in an outlet direction oriented perpendicularly to the surface to be coated, the application and the layer formation are improved. The reason for this is that an asymmetrical distortion of the projection onto the surface during rotation as a result of the non-perpendicular outlet direction can be compensated or partially compensated for by the eccentric displacement of the axis of rotation.

According to a particularly preferred variant of the method, the nozzle has a longitudinal extension of the nozzle of DO, wherein the longitudinal extension is rotated about an angle of rotation $\alpha'=\alpha*k$ relative to the transport direction of the planar object such that $\sin(\alpha')*D0$ corresponds to the planar object being acted upon over its entire width. The factor k is an empirically determined correction factor which preferably assumes a value between 0.75 and 1.25. On the one hand, the procedure explained comprises the concept that the nozzle has a longitudinal extension, wherein the longitudinal extension is oriented perpendicularly to the direction of transport of the strip at an angle of rotation of $\alpha=90$ degrees, preferably the nozzle opening also lies in a plane parallel to the strip surface. In an idealized model, a rotation of the nozzle by an angle of rotation $\alpha$ starting from a 90 degree orientation would lead to a reduction in the lateral extent of the coating on the planar object, and in the example of a strip only a strip with a smaller width would thus be completely coated over its entire lateral extent. In other words, by means of this procedure, a strip having a smaller width can be coated with equally high efficiency since the proportion of material present in the gas phase exiting the nozzle opening, which is distributed past the strip edges in the interior of the vacuum chamber, can be kept to a minimum. The factor k takes into account the fact that, as experience has shown, the ratios prevailing in the actual coating scenario did not achieve a maximum coating width in the transverse extension of the object to be coated at the above-mentioned angle α=90 degrees, but instead, depending on specific circumstances, a deviation exists in individual cases which is to be corrected empirically. The specific embodiment of the invention explained thus comprises in particular the specific step of an empirically determined correction factor existing and being used.

In a development of the method according to the invention, it is furthermore provided that the orientation of the nozzle is also changed by moving the axis of rotation to a direction pointing perpendicularly to the axis of rotation, or by adjusting an eccentricity of the nozzle outlet relative to the axis of rotation.

The change takes place in such a way that material directed past the surface does not exceed a tolerated maximum overhang at least on one edge, preferably on both edges. In other words, in addition to the transverse extension to which material is applied on the surface of the planar object in terms of the amount of the transverse extension to which material is applied, the position thereof can also be taken into account by changing the position of the nozzle in perpendicular to the transport direction of the planar object, for example strip.

Particularly preferably, the axis of rotation is arranged relative to the nozzle in such a way that the axis of rotation divides the nozzle in its longitudinal extension D0 into two portions D1 and D2, where D0=D1+D2, such that D1/D2=Delta1/Delta2, wherein Delta1 is a reduction in the width of the planar object on a first side of the axis of rotation and Delta 2 is a reduction in the width of the planar object on a second side of the axis of rotation, in particular a reduction in width with respect to an axis of symmetry of the transport device used to transport the planar object. This measure ensures that the change in the orientation of the rotatable nozzle can not only be adjusted with respect to a change in the transverse extensions of a planar object, which are provided symmetrically with respect to the axis of rotation of the planar object at both edges of the planar object, but also an adjustment to the orientation of the rotatable nozzle can be carried out in order to take into account asymmetrically implemented changes in the transverse extension.

It is particularly preferred that the planar object has a width changing in the longitudinal direction. For example, the planar object can be strip metal, in particular strip steel, which has a transverse extension which varies as a function of its longitudinal position. According to a preferred method variant, such a planar object is coated, wherein, during the coating process, the orientation of the nozzle outlet relative to the surface to be coated is continuously adjusted, so that the orientation of the nozzle is adjusted in each case to the longitudinal position of the planar object currently to be coated. The continuous adjustment can be based either on an in-situ measurement of a transverse extension during the coating process, which is carried out, for example, by means of optical length detection, or, however, in the case of a known dependency between the transverse extension of a planar object and its longitudinal position, can be carried out based on a time-dependent control of a nozzle rotation during the coating process.

Further details, features, and advantages of the subject matter of the invention result from the following description in connection with the drawings, which show embodiments of the invention by way of example.

It goes without saying that the features mentioned above and below can be used not only in the combination indicated but also in other combinations or in isolation.

DETAILED DESCRIPTION

Figure 1A:
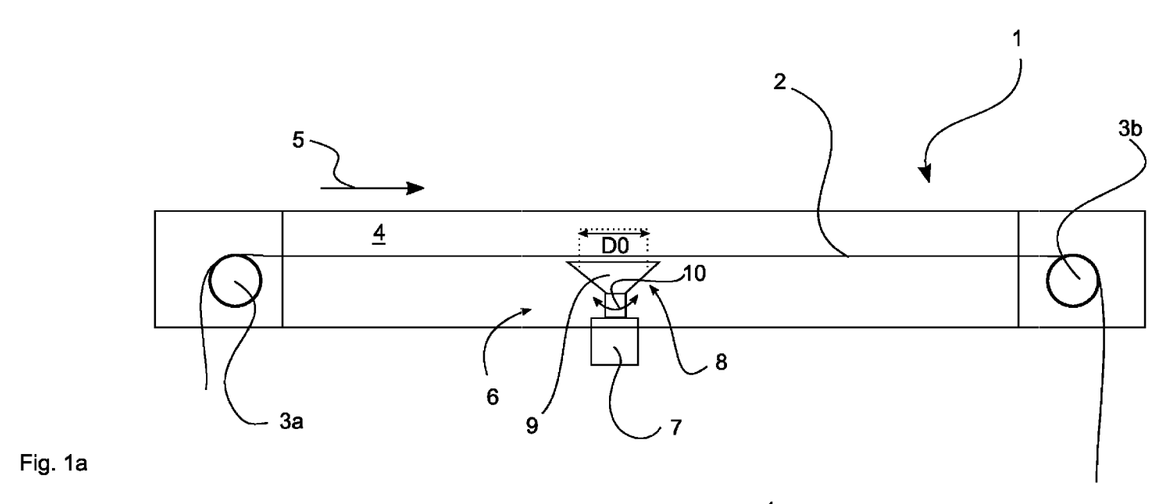
FIG. 1a, 1b: a schematic representation of a coating plant according to the invention.

FIG. 1a shows a coating plant 1 which is designed to coat a planar object 2 designed as a strip metal 2. The coating plant 1 is designed as a strip coating plant and, for this reason, comprises a device for transporting the strip, as is known from the field of the production and coating of strip metal, in particular strip steel. In the embodiment shown, the strip is transported by means of transport rollers 3a, 3b. The strip is inserted into a vacuum chamber 4 and passed through the vacuum chamber in which a vacuum is present, for example at a pressure between 0.1 mbar and 20 mbar.

The strip is guided through the vacuum chamber in a transport direction 5 and past a device 6 for vapor deposition of the material, which device is designed in the present embodiment as a jet-PVD device 6 known to a person skilled in the art in terms of its basic mode of operation. With the vapor deposition device, a material present in the gas phase is directed onto the surface of the strip metal in order to form a coating there by condensation. The device 6 has an evaporation portion 7 for evaporating the material into the gas phase and a nozzle portion 8 coupled to the evaporation portion 7. The nozzle portion 8 comprises in particular a nozzle 9 arranged within the vacuum chamber 4 and having a nozzle outlet which is directed toward the surface of the strip to be coated in order to guide material emerging from the nozzle outlet and present in the gas phase toward the surface so that it can condense there and thereby form a coating. The nozzle 8 is rotatably mounted and coupled to the evaporation portion 7. In the schematic representation, the evaporation portion 7 also partially extends into the vacuum chamber 4, wherein this is neither essential nor necessary and can be carried out as required by a person skilled in the art entrusted with the implementation of the invention. However, it is essential that the nozzle 9 is arranged with the nozzle outlet inside the vacuum chamber 4 in order to ensure the surface of the strip is coated.

The nozzle 9 is rotatably mounted, as symbolized by the arrows 10. By means of the rotation, the orientation of the nozzle outlet relative to the surface of the strip 2 to be coated can be changed, wherein, in the embodiment shown, the preferred embodiment was selected according to which the axis of rotation of the nozzle 9 is oriented perpendicularly to the surface to be coated and according to which a nozzle outlet located within the nozzle is shaped in such a way that the material in the gas phase exiting the nozzle outlet exits the nozzle in the direction of the axis of rotation, that is to say that, in the example shown in which the axis of rotation is oriented perpendicularly to the surface to be coated, the material in the gas phase acts on the surface in the direction perpendicular to the surface to be coated.

In the embodiment shown, the nozzle 9 comprises a nozzle outlet in the form of a slot having a longitudinal extension D0. The nozzle is mounted or the nozzle outlet is arranged in the nozzle 9 in such a way that, when the nozzle 9 is rotated about its axis of rotation, the rotational movement of the nozzle 9 would take place in a plane parallel to the strip surface, and that the nozzle outlet is simultaneously perpendicular to the main exit direction of the material present in the gas phase. In the illustration shown, the nozzle 9 is oriented at an angle α of zero to the transport direction of the strip. In the orientation shown, only a narrow strip of the strip would be coated. By contrast, with a rotation of 90 degrees about the shown axis of rotation, a strip having a width, i.e., with an extension in its transverse direction, which is oriented in the present representation perpendicularly into the paper plane, would be coated, which corresponds to the longitudinal extension D0 of the strip, wherein slight deviations resulting from the flow profile of the particles flowing out of the nozzle outlet are possible.

Figure 1B:
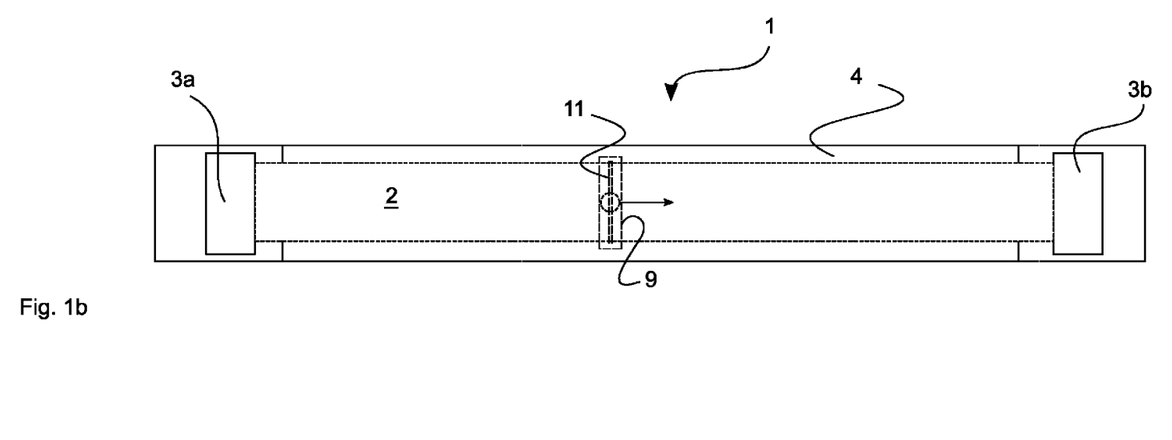

FIG. 1b is a plan view of a representation of the coating plant 1 shown in FIG. 1a. In particular, it can be seen that the nozzle outlet 11 of the nozzle 9, which is designed as a slot 11, assumes an angle α of 90 degrees to the direction of transport of the strip 2, i.e., it was rotated by 90 degrees relative to the position from FIG. 1a. The longitudinal extension of the nozzle outlet 11 is greater than the width of the strip in its transverse direction. If the strip 2 were to have a smaller width in the transverse direction than the one shown in FIG. 1b, then it could be ensured by decreasing the angle α that, despite the reduced strip width, material that does not exit the nozzle outlet or only a small tolerated amount of which material exits the nozzle outlet, passes the strip edges into the vacuum chamber, in particular in a region of the vacuum chamber located below the strip, and thereby is no longer available for forming a coating. By providing a rotatable nozzle, it is thus ensured that efficient coating of a strip is possible for different strip widths and even for variable strip widths within the same strip.

Figure 2:
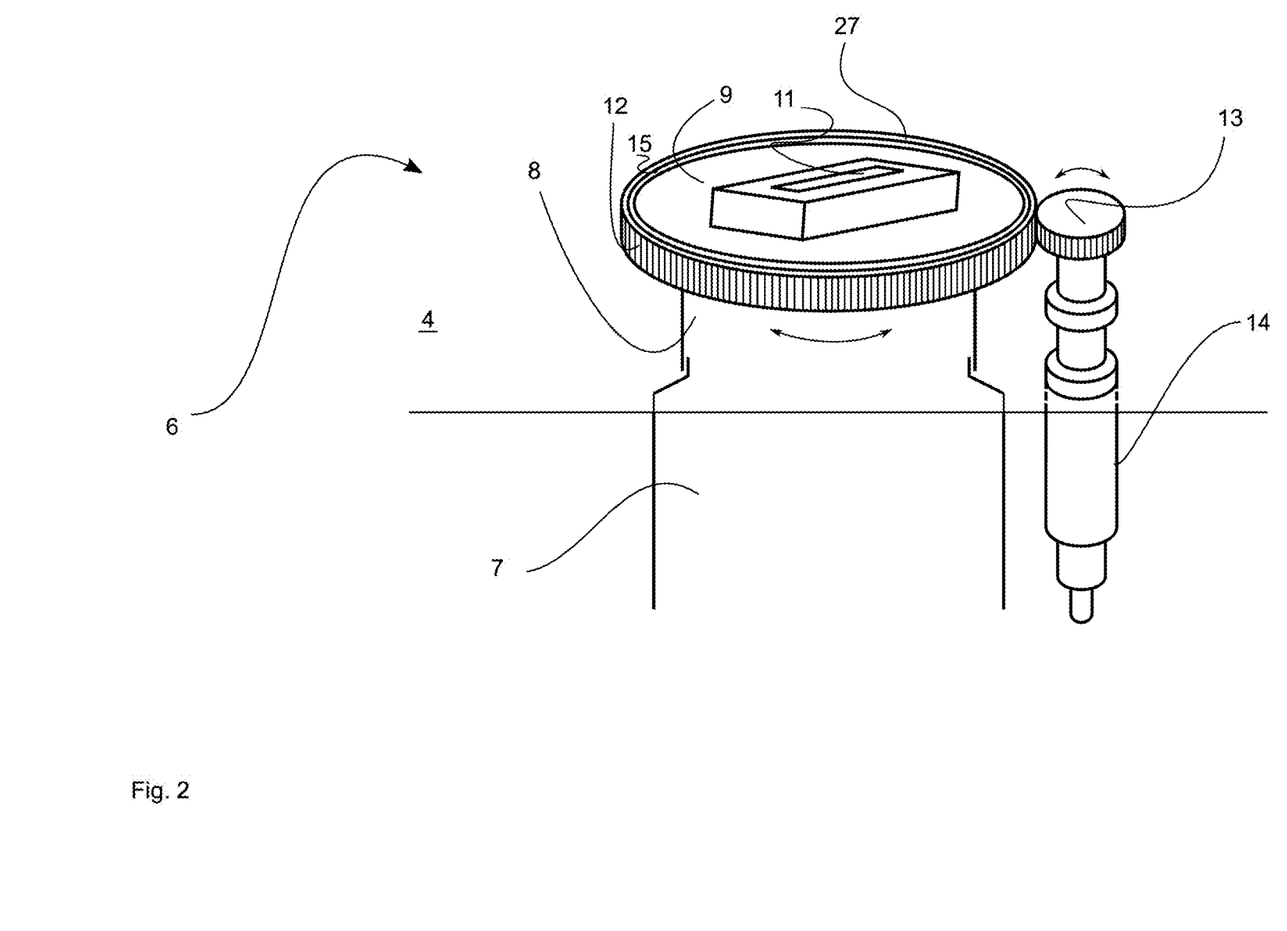
FIG. 2: a schematic representation of a first embodiment of a rotatably mounted nozzle.

FIG. 2 shows a schematic representation of an embodiment of a vapor deposition device as a possible component of the coating plant according to the invention. The nozzle 9 shown in FIG. 2 has a circular-cylindrical external mold section 27 to which a sprocket 12 is clamped. A counter element 13 designed as a pinion 13 is in engagement with the sprocket 12. The pinion 13 is coupled to a shaft 14 leading out of the vacuum chamber 4, wherein the shaft is coupled to a rotary drive (not shown in FIG. 2) for rotating the shaft and rotating the nozzle as a result thereof. In order to ensure that the hot nozzle 9 is thermally insulated from the driven components, a thermal insulation means 15 designed as a ceramic ring 15 is arranged between the nozzle 9 and the sprocket 12.

Figure 3:
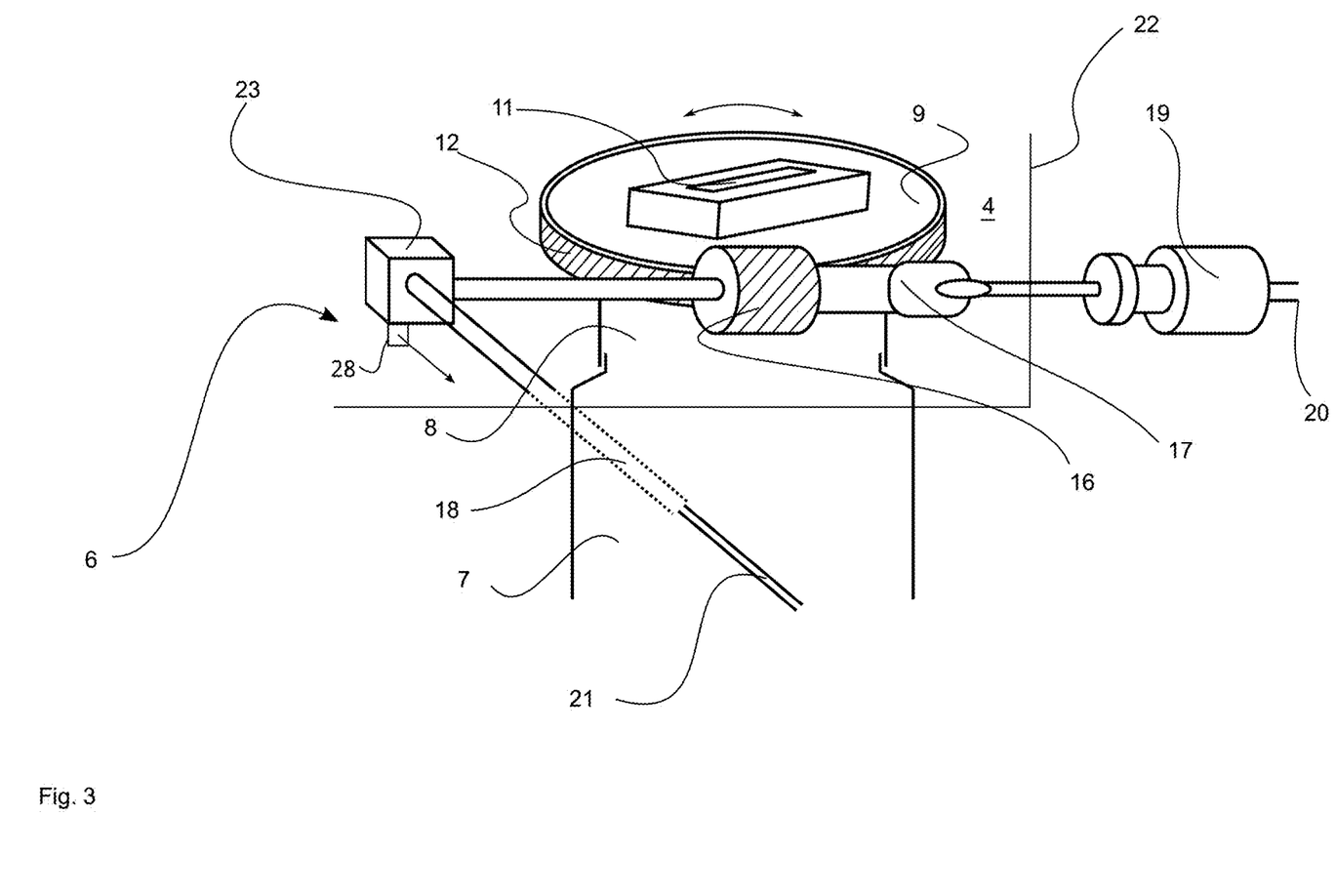
FIG. 3: a schematic representation of a second embodiment of a rotatably mounted nozzle.

FIG. 3 shows a further embodiment of a vapor deposition device as a possible component of the coating plant according to the invention. In contrast to the embodiment in FIG. 2, in the embodiment in FIG. 3, a helical sprocket 12 is provided which is in engagement with a counter element designed as a worm shaft 16, which, in turn, is coupled to a shaft leading out of the vacuum chamber 4 through the wall 22. The shaft is coupled to a rotary drive 19. The shaft has a coolant feedthrough 20, i.e., a line which leads through the shaft and is a component of a coolant circuit, for cooling the shaft. Whereas in the embodiment in FIG. 2, passive insulation of the hot nozzle 9 relative to the sprocket 12 is thus provided, in the embodiment in FIG. 3, active cooling of the elements in contact with the nozzle takes place. The shaft is adjusted by means of a universal joint 17 having a transverse degree of freedom of movement. The shaft can be taken out of engagement with the sprocket and placed back into engagement with the sprocket via a coupling piece 23 and a transverse drive means coupled thereto. The shaft 18 is also coupled via a feed and discharge line 21 to a coolant circuit for active cooling of the shaft 18 as components which are indirectly in contact with the sprocket 12.

Figure 4:
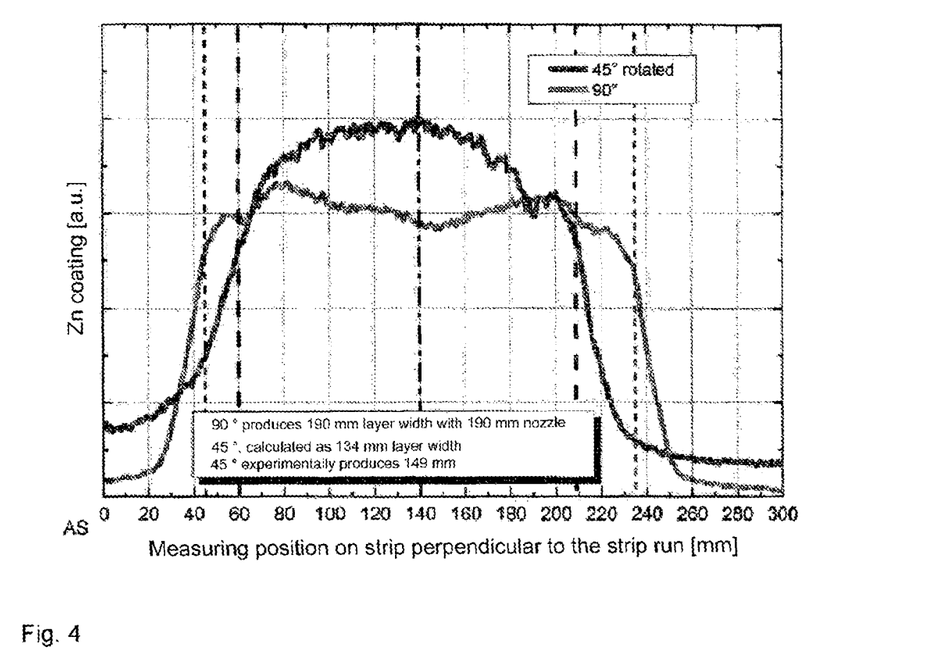
FIG. 4: a Zn coating thickness in the transverse direction of a strip.

FIG. 4 shows a layer thickness profile of a Zn coating, wherein the coating was applied once at an angle of 90 degrees to the direction of transport and once at an angle of 45 degrees. It can be seen that the width of the layer can be adjusted by rotating the nozzle.

Figure 5:
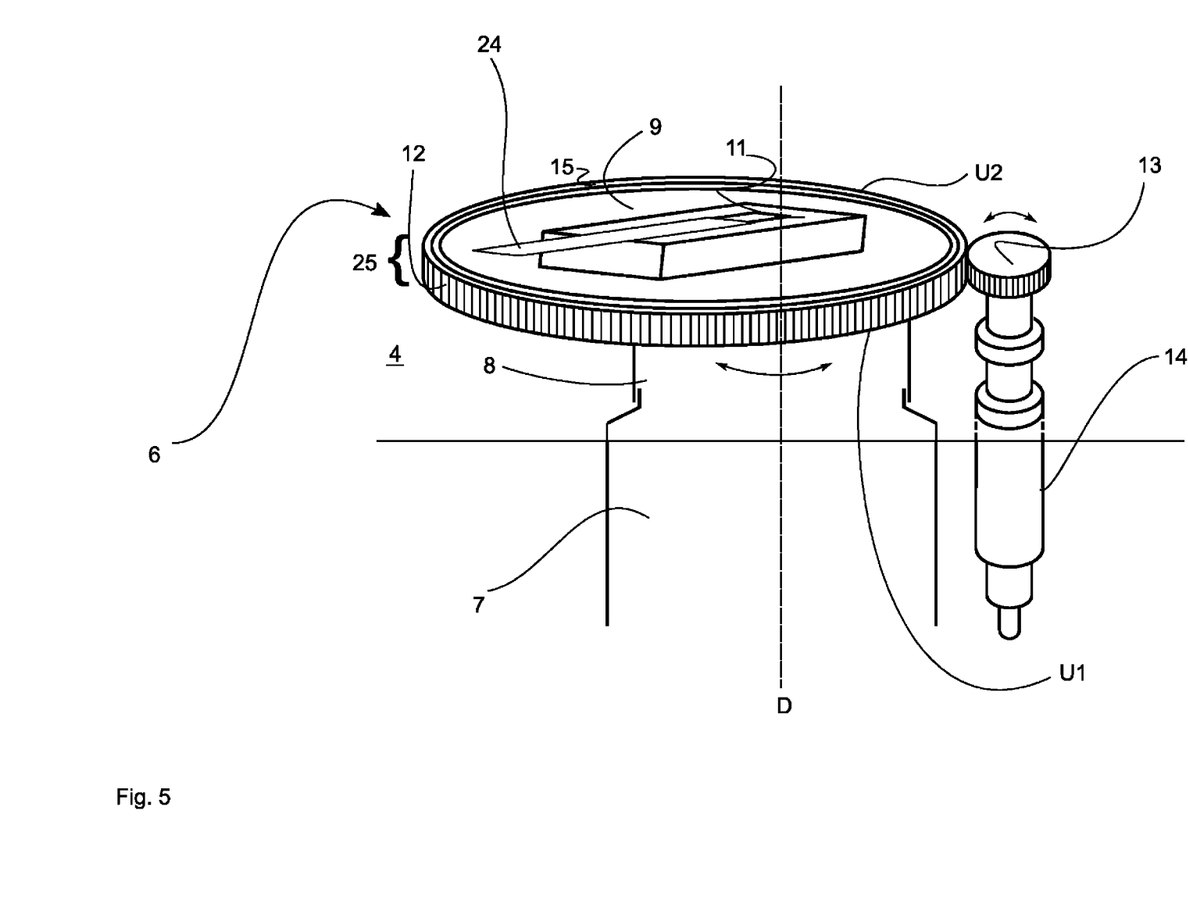
FIG. 5: a schematic representation of a third embodiment of a rotatably mounted nozzle.

FIG. 5 is a schematic representation of a third embodiment of a rotatably mounted nozzle. The third embodiment is an adapted variant of an embodiment according to FIG. 2, which is why only the differences between the third embodiment and the first embodiment are shown, and reference is also made to the description of FIG. 2.

On the basis of the schematic representation in FIG. 5, three measures are explained with which it is achieved that the axis of rotation D is positioned eccentrically with respect to the nozzle outlet 11.

The first measure is that the axis of rotation D is displaced eccentrically relative to the nozzle outlet 11, which means that the shape and position of the nozzle outlet and axis of rotation D are selected such that the axis of rotation D does not intersect the nozzle outlet at a point of symmetry which is on the central axis of the nozzle outlet 11 which cuts the slot-shaped nozzle outlet into two halves in the longitudinal direction.

The second measure consists in that the external mold section, which in the present structural embodiment is the portion of the nozzle extending in the axial direction in the region characterized by the clamp 25, comprises, in the region between the point U1 and therefrom at sheet level counterclockwise toward U2, a peripheral portion which has teeth on the one hand and, on the other hand, in this portion, is circular-cylindrical with the peripheral portion U1-U2 comprising axis of rotation D of the nozzle portion in the central axis of the teeth. The part adjoining the peripheral portion, on the other hand, is not circular-cylindrical, but instead describes a more oval shape. This means that the drive by pinions 13 is only possible within U1-U2, with the desired effect that an eccentric movement of the nozzle outlet is brought about.

The third measure is that the nozzle portion has the sliding flap 24 with which the nozzle outlet can be partially closed.

It goes without saying that the adaptations of the embodiment in FIG. 2 shown in FIG. 5 and described above are implemented analogously in other embodiments, for example in that of FIG. 3.

Figure 6:
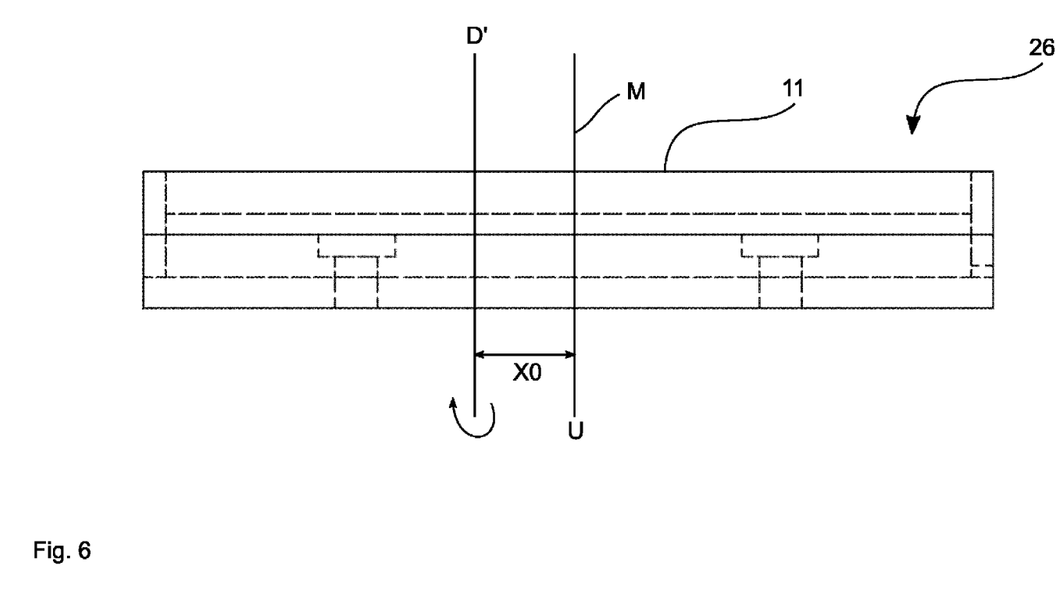
FIG. 6: a schematic representation of a nozzle and a nozzle outlet.

FIG. 6 is used to explain the effect of an axis of rotation that is eccentric to the nozzle outlet: FIG. 6 is a plan view of a nozzle 26 which resembles the nozzle portion 25 of FIG. 5. It can be seen that the axis of rotation D' of the nozzle 26 is displaced relative to a center M of the nozzle outlet 11. The displacement is provided by a distance X0. With the nozzle 26 shown, a partial compensation for an asymmetry can be achieved during a clockwise rotation, characterized by the arrow U, about the axis D'.

The invention claimed is:

1. A coating plant for coating a planar object with a material in the gas phase, wherein the coating plant comprises:
   a vacuum chamber for feeding through the planar object to be coated,
   a device for the vapor deposition of the material, having an evaporation portion for evaporating the material into the gas phase, and a nozzle portion coupled to the evaporation portion, wherein the nozzle portion has a nozzle which is arranged within the vacuum chamber and has a nozzle outlet for directing and discharging the material present in the gas phase from the nozzle outlet toward a surface to be coated of the planar object passed through the vacuum chamber in order to coat said object continuously with material that acts and condenses on the surface,
   wherein the nozzle is rotatably mounted in order to change the orientation of the nozzle outlet relative to the surface to be coated and the nozzle has a cylindrical external mold section which is toothed in a peripheral portion of its circumference or over its entire circumference with teeth, the teeth being in engagement with a drivable counter element engaging in the teeth in order to rotate the nozzle by driving the counter element.

2. The coating plant according to claim 1, wherein the nozzle outlet is a slot.

3. The coating plant according to claim 1, wherein the nozzle is mounted such that, when the nozzle is rotated, the nozzle outlet performs a rotational movement in a plane parallel to the surface to be coated, and/or
   in that an axis of rotation for rotating the nozzle is oriented perpendicularly to the surface to be coated.

4. A coating plant for coating a planar object with a material in the gas phase, wherein the coating plant comprises:
   a vacuum chamber for feeding through the planar object to be coated,
   a device for the vapor deposition of the material, having an evaporation portion for evaporating the material into the gas phase, and a nozzle portion coupled to the evaporation portion, wherein the nozzle portion has a nozzle which is arranged within the vacuum chamber and has a nozzle outlet for directing and discharging the material present in the gas phase from the nozzle outlet toward a surface to be coated of the planar object passed through the vacuum chamber in order to coat said object continuously with material that acts and condenses on the surface,
   wherein the nozzle is rotatably mounted in order to change the orientation of the nozzle outlet relative to the surface to be coated and the nozzle has a cylindrical external mold section, and the external mold section is fitted into a sprocket which is toothed in a peripheral portion of its circumference or over its entire circumference with teeth or has a sprocket which is toothed in a peripheral portion of its circumference or over its entire circumference with teeth, the sprocket being in engagement with a drivable counter element engaging in the sprocket in order to rotate the nozzle by driving the counter element.

5. The coating plant according to claim 4, wherein the nozzle and the sprocket are designed to be thermally isolated from one another by a thermal insulation means arranged between the external mold section of the nozzle and the sprocket,
   the thermal insulation means preferably being an insulator ring comprising or consisting of a ceramic material.

6. The coating plant according claim 1, wherein the counter element is a pinion which is coupled to a shaft leading out of the vacuum chamber, the shaft being coupled to a rotary drive for rotating the shaft and rotating the nozzle as a result thereof.

7. The coating plant according to claim 1, wherein the counter element is a worm shaft which is coupled to a shaft leading out of the vacuum chamber, the shaft being coupled to a rotary drive for rotating the shaft and rotating the nozzle as a result thereof, the shaft having a coolant feedthrough for cooling the shaft.

8. The coating plant according to claim 7, wherein the shaft is adjusted by means of a coupling element designed as a universal joint, with a transverse degree of freedom of movement, the shaft being movable out of engagement with the sprocket and back into engagement with the sprocket by a coupling piece and a transverse drive means coupled thereto.

9. A coating plant for coating a planar object with a material in the gas phase, wherein the coating plant comprises:
   a vacuum chamber for feeding through the planar object to be coated,
   a device for the vapor deposition of the material, having an evaporation portion for evaporating the material into the gas phase, and a nozzle portion coupled to the evaporation portion, wherein the nozzle portion has a nozzle which is arranged within the vacuum chamber and has a nozzle outlet for directing and discharging the material present in the gas phase from the nozzle outlet toward a surface to be coated of the planar object passed through the vacuum chamber in order to coat said object continuously with material that acts and condenses on the surface,
   wherein the nozzle is rotatably mounted in order to change the orientation of the nozzle outlet relative to the surface to be coated, wherein
   an axis of rotation for the nozzle is movable in a direction perpendicular to the axis of rotation, and/or
   the axis of rotation is adjusted in eccentricity relative to the nozzle outlet, and/or
   the axis of rotation is adjustable in eccentricity relative to the nozzle outlet, and/or
   wherein the nozzle includes an external mold section including a toothed peripheral portion being a sprocket that is circular-cylindrical having a peripheral portion having the axis of rotation in the central axis of the toothed peripheral portion, and furthermore the axis of rotation is positioned eccentrically relative to the nozzle outlet.

10. The coating plant according to claim 9, wherein the nozzle portion has at least one closing means for partially or completely closing the nozzle outlet designed as a movable sliding flap for adjusting the eccentricity of the axis of rotation with respect to the nozzle outlet, wherein the nozzle outlet is designed as a slot.

* * * * *